(12) United States Patent
Ma (10) Patent No.: US 8,008,954 B2
(45) Date of Patent: Aug. 30, 2011

(54) MULTI-PHASE SIGNAL GENERATOR AND METHOD

(75) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 12/245,444

(22) Filed: Oct. 3, 2008

(65) Prior Publication Data

US 2010/0085099 A1 Apr. 8, 2010

(51) Int. Cl.
*H03L 7/00* (2006.01)
(52) U.S. Cl. ......... 327/153; 327/144; 327/155; 375/375
(58) Field of Classification Search .................. 327/141, 327/144–163; 331/1 A, 15–17; 375/373–376
See application file for complete search history.

(56) References Cited

U.S. PATENT DOCUMENTS

| | | | | |
|---|---|---|---|---|
| 6,304,116 B1* | 10/2001 | Yoon et al. | ..................... | 327/161 |
| 6,801,472 B2 | 10/2004 | Lee | ............................... | 365/233 |
| 6,996,026 B2 | 2/2006 | Brox et al. | ..................... | 365/233 |
| 7,084,686 B2 | 8/2006 | Zimlich | ......................... | 327/291 |
| 7,106,655 B2 | 9/2006 | Lee | ............................... | 365/233 |
| 7,426,145 B2 | 9/2008 | Lee et al. | .................. | 365/189.05 |
| 7,706,210 B2 | 4/2010 | Kim et al. | ................... | 365/233.1 |
| 7,872,924 B2 | 1/2011 | Ma | ........................... | 365/189.05 |
| 7,911,245 B2 | 3/2011 | Ma | ............................. | 327/145 |
| 2008/0252340 A1* | 10/2008 | Yeo et al. | ...................... | 327/156 |
| 2010/0085094 A1 | 4/2010 | Ma | ................................. | 327/158 |
| 2010/0103746 A1 | 4/2010 | Ma | ........................... | 365/189.05 |

OTHER PUBLICATIONS

Ki-Won Lee et al.; "*A 1.5-V 3.2 Gb/s/pin Graphic DDR4 SDRAM With Dual-Clock System, Four-Phase Input Strobing, and Low-Jitter Fully Analog DLL*"; IEEE Journal of Solid-State Circuits, vol. 42; No. 11; Nov. 2007; pp. 2369-2377.

* cited by examiner

*Primary Examiner* — Lincoln Donovan
*Assistant Examiner* — Brandon S Cole
(74) *Attorney, Agent, or Firm* — Dorsey & Whitney LLP (57) ABSTRACT

Multi-phase signal generators and methods for generating multi-phase signals are described. In one embodiment, the clock generator generates quadrature clock signals including those having 90, 180, 270 and 360 degrees phase difference with a first clock signal. One of the intermediate clock signals may be used as an enable signal to guide locking of all signals. For example, the 180 degree clock signal may be inverted and used as an enable signal to guide locking of the initial and 360 degree signals in a single phase adjustment procedure. The 0 and 360 degree signals may be delayed before their phase is compared to compensate for duty cycle error in the clock signals.

32 Claims, 8 Drawing Sheets

MULTI-PHASE SIGNAL GENERATOR AND METHOD

TECHNICAL FIELD

Embodiments of the invention relate generally to periodic signal generating systems, and more particularly, in one or more embodiments, to methods and systems for fast initializing a multi-phase clock signal generator.

BACKGROUND OF THE INVENTION

Periodic signals are used in a variety of electronic devices. One type of periodic signals are clock signals that can be used to establish the timing of a signal or the timing at which an operation is performed on a signal. For example, data signals are typically coupled to and from memory devices, such as synchronous dynamic random access memory ("SDRAM") devices, in synchronism with a clock signal. More specifically, read data signals are typically coupled from a memory device in synchronism with a read data strobe signal. The read data strobe signal typically has the same phase as the read data signals, and it is normally generated by the same memory device that is outputting the read data signals. Write data signals are typically latched into a memory device in synchronism with a write data strobe signal. The write data strobe signal should have a phase that is the quadrature (having a phase 90-degrees relative to the phase) of the write data signals so that a transition of the write data strobe signal occurs during a "data eye" occurring at the center of the period in which the write data signals are valid.

Internal clock signals generated in electronic devices, for example, memory devices or memory controllers, are often synchronized or have some other controlled phase relationships relative to external or internal clock signals. For example, with reference to a memory device, a quadrature clock signal used for latching write data and outputting read data may be generated in the memory device to which the data are being written. The quadrature clock signal is typically generated in the memory device from an internal clock signal that is also derived from the system clock signal.

Internal clock signals having synchronized or some other controlled phase relationships with external and internal clock signals may also be used for applications other than for use as a write data and outputting read data strobe signal. For example, a "frequency doubler" circuit, which generates an output clock signal having twice the frequency of an input clock signal, can be implemented using an appropriate logic circuit that receives the input clock signal and quadrature versions of the input clock signal. Internal clock signals may also be generated having other than a quadrature phase relationships. Generally, any phase relationship between output clock signals can be used.

Various techniques can be used to generate a quadrature clock signal or read/write data strobe signal. If the frequency of the internal clock signal is fixed, quadrature clock signals can be generated by a timing circuit that simply generates a transition of the quadrature clock signals a fixed time after a corresponding transition of the internal clock signal. However, synchronous memory devices are typically designed and sold to be operated over a wide range of clock frequencies. Therefore, it is generally not practical to use a fixed timing circuit to generate quadrature signals from the internal clock signal. Instead, a circuit that can adapt itself to an internal clock signal having a range of frequencies must be used.

An example of such a circuit is a multi-phase clock signal generator. A multi-phase clock signal generator, as known, generates multi-phase clock signals to provide several clock signals having fixed phase relationships to a reference clock signal, such as an external or internal clock signal. In operation, a multi-phase clock signal generator should be initialized to ensure the generated clock signals have the correct phase relationship. A conventional method of initializing a multi-phase clock signal generator will now be described with reference to FIG. 1. The conventional multi-phase clock signal generator 100 includes a delay line 105 having a plurality of delay elements 110a-d coupled in series with each other. Each of the delay elements 110a-d has two inputs, two outputs, and a control input (not shown). Each delay element 110a-d has two inputs and two outputs to provide for a double-ended configuration where both a clock signal 120 and its complement 121 are received and processed. A single-ended configuration may also be used.

Figure 1:
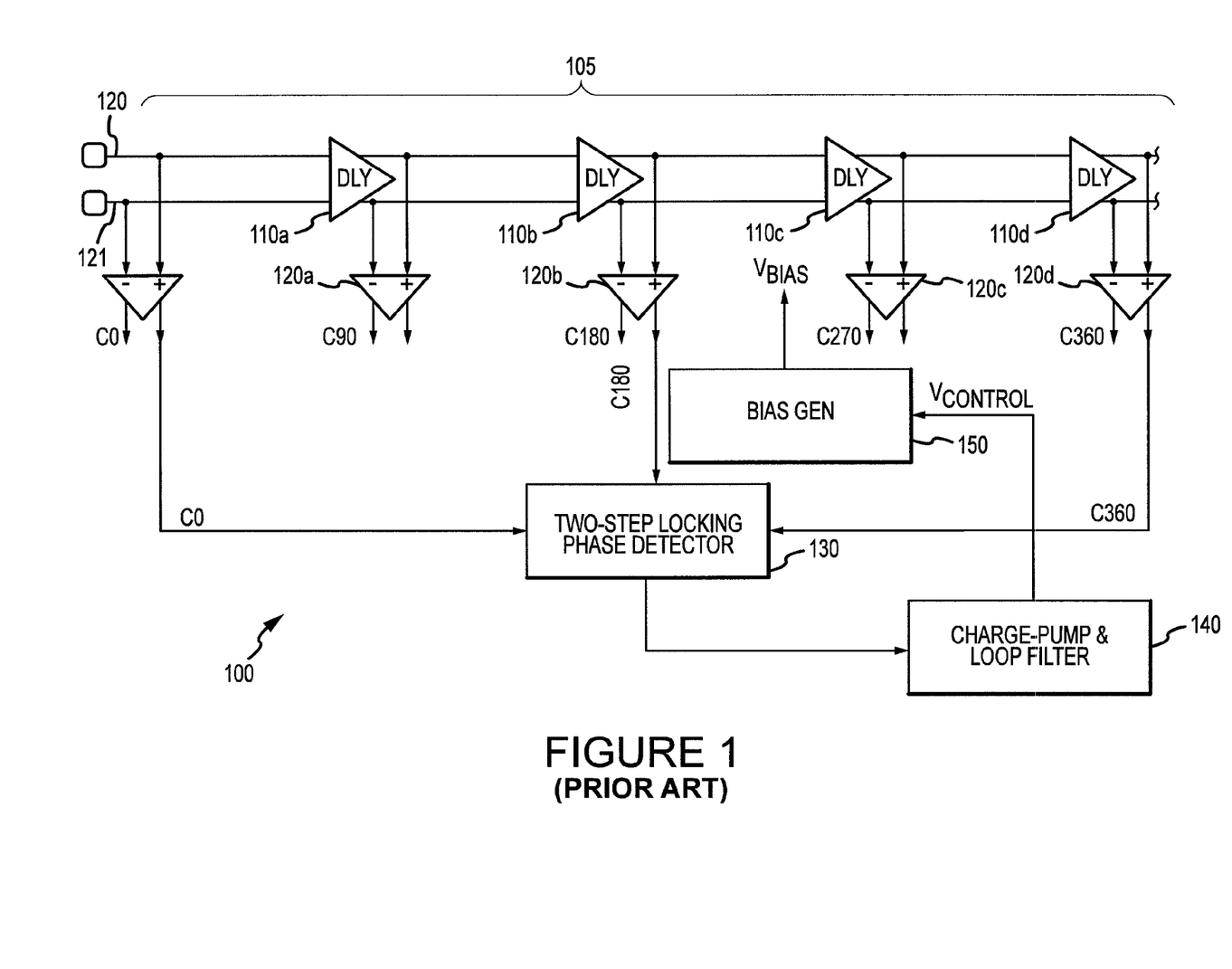
FIG. 1 is a schematic diagram of a multi-phase clock signal generator according to the prior art.

Each of the delay elements 110a-d couples a signal from its input to its output with a delay corresponding to a delay control signal applied to its control input The input of the initial delay element 110a receives a clock signal 120 and its complement 121. The outputs of all but the last delay element 110d is coupled to the input of the subsequent delay element. The output of each delay element 110a-d forms a respective tap of the delay line 105 to provide four clock signals C90, C180, C270, and C360, respectively, C360 is a one clock delayed version of C0 at lock status. As indicated by their names, the C90 signal has a 90 degree phase difference with the input clock signal 120. The C180 signal has a 180 degree phase difference with the input clock signal 120, the C270 signal a 270 degree phase difference, and the C360 signal a 360 degree phase difference. As explained in greater detail below, the amount of voltage-controlled delay provided by each of the delay elements 110a-d sets a minimum and maximum amount of delay that can be achieved by the delay line 105.

To ensure the proper phase relationships are maintained correctly during operation between the four provided clock signals, a two-step locking phase detector 130 receives the input clock signal 120, the C180 signal and the C360 signal. The phase detector 130 will first lock the inversion of C180 signal to the C0 signal, and then in the second step, lock the C360 signal with the C0 signal. To lock the C0 and C180 signal, the phase detector 130 produces an error signal corresponding to a mismatch between the falling edge of the C180 signal and the rising edge of the C0 signal. The error signal is used to adjust the delay of the delay elements 110a-d such that the C0 and C180 signals are 180 degrees apart. As shown in FIG. 1, the error signal is converted to a control signal by a control signal generator, such as charge-pump and loop filter 140. The control signal is used by a bias voltage generator 150 to couple a $V_{BIAS}$ signal to the control inputs of the delay elements 110a-d. In the second step of operation of the phase detector 130, an error signal is generated corresponding to a mismatch between a rising edge of the C0 signal and a rising edge of the C360 signal. In a similar manner, the error signal is used to adjust the delay of the delay elements 110a-d. This two-step locking process may be sufficient in some cases where the duty cycle or slow locking time is not an issue. However, difficulties occur when the incoming clock signal contains some duty cycle distortion, as will now be explained with reference to FIG. 2.

Figure 2:
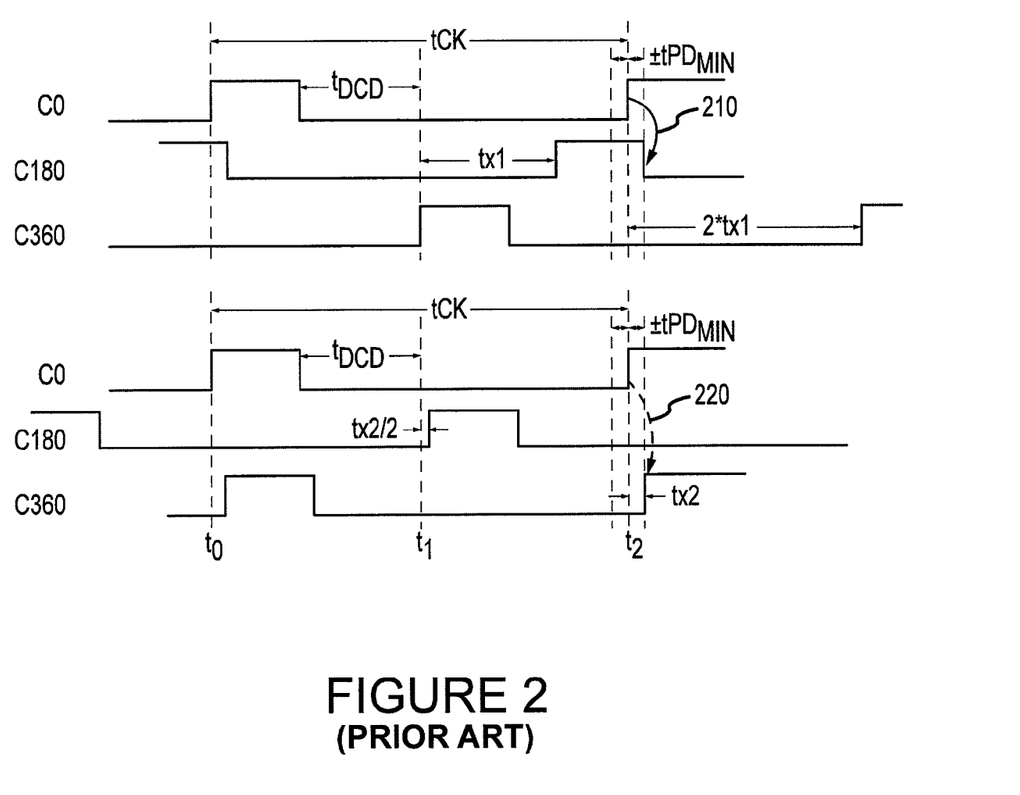
FIG. 2 is a timing diagram illustrating the operation of the clock signal generator of FIG. 1.

FIG. 2 is a timing diagram illustrating signals from FIG. 1. A clock period is shown in FIG. 2 as $t_{CK}$, between $t_0$ and $t_2$. The incoming clock signal, C0 has an amount of duty cycle distortion shown by $t_{DCD}$. That is, in the case where the C0 signal had an ideal, 50 percent duty cycle, the high pulse would extend from time $t_0$ to time $t_1$ in FIG. 2. However, as shown, the C0 high pulse is significantly shorter. The phase detector 130 then locks the falling edge of the C180 signal with the rising edge of the C0 signal at time $t_2$, as shown by arrow 210. The phase detector 130 will lock the signals within a tolerance, shown by $\pm t_{PDmin}$ in FIG. 2. Due to the duty cycle distortion, the rising edge of the C180 signal is $t_{x1}$ off from time $t_1$, where the signal should be for a 180 degree phase difference. Accordingly, the C180 signal has been delayed $t_{x1}$ too much. Recall that adjusting the control voltage applied to the delay elements 105 of FIG. 1 adjusts the delay of all the delay elements 110a-d. The C360 signal will now be $2*t_{x1}$ off from locked with C0, as shown in FIG. 2. The second step of operation of the phase detector 130 will be to adjust the delay of the delay elements 110a-d such that the C360 signal is synchronized with the C0 signal, by matching the rising edge of the C0 signal with the rising edge of the C360 signal, as shown in the second timing diagram of FIG. 2 by the arrow 220.

Duty cycle distortion in incoming clock signals is not uncommon, and, taking signal jitter into consideration, could be a significant portion of reference clock period. With duty cycle distortion, the two-step locking phase detector 130 may cease to function properly. The delay line 105 may have insufficient range to accommodate the lengthy $t_{x1}$ and $2*t_{x1}$ delay times that should be compensated for according to FIG. 2. One solution to this problem is to place a duty-cycle control element prior to and in series with the multi-phase clock signal generator 100. This may ensure the multi-phase clock signal generator receives a clock signal with a correct duty cycle. However, a duty cycle control element also has a limited working range and takes much longer time to achieve corrected output signals. Accordingly, this solution may also become impractical as speeds increase and timing requirements tighten.

There is accordingly a need for an improved system and method for providing multi-phase clock signals.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Figure 3:
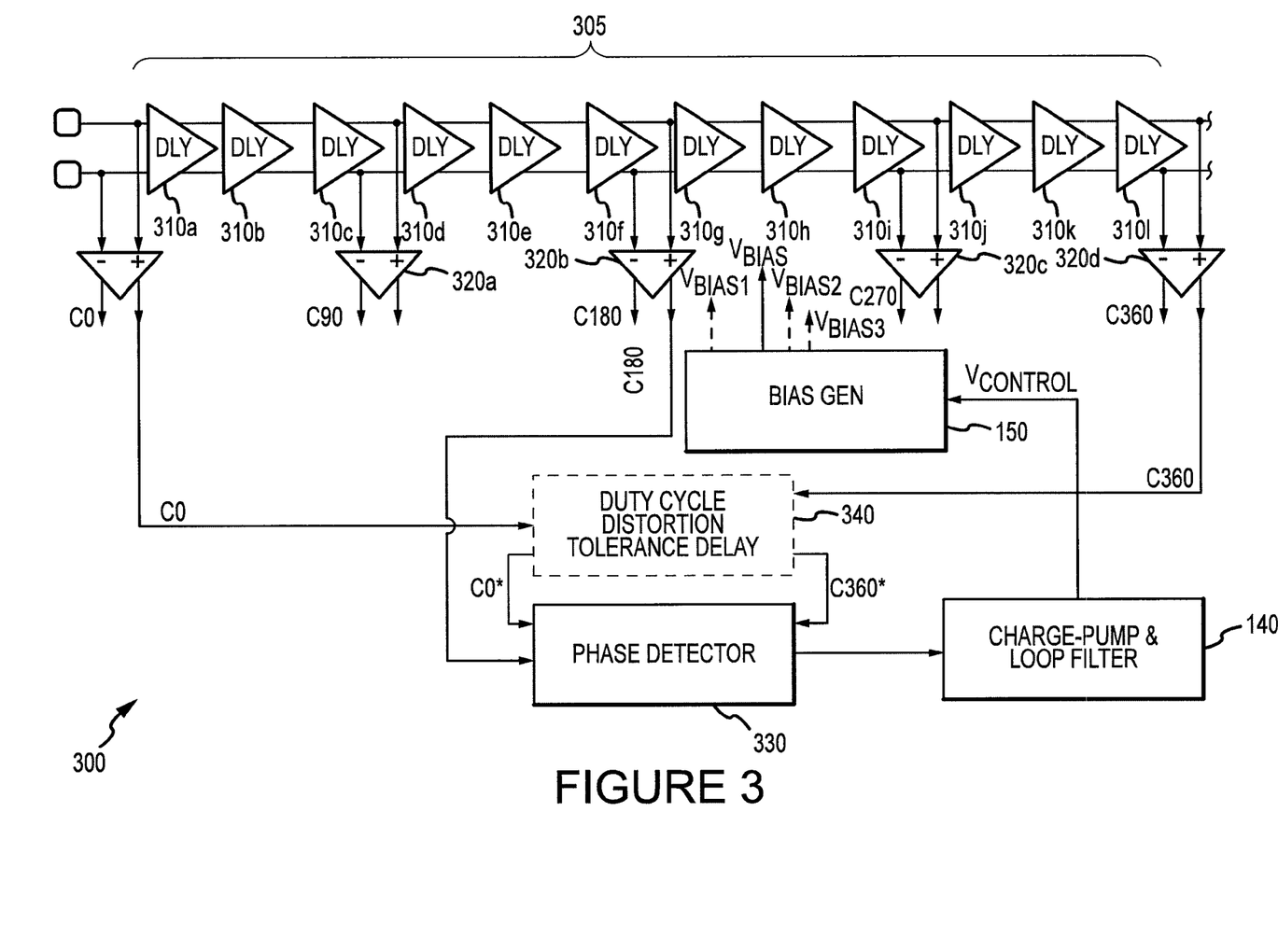
FIG. 3 is a schematic diagram of a multi-phase clock signal generator according to an embodiment of the present invention.

An embodiment of a multi-phase clock signal generator 300 according to an embodiment of the present invention is shown schematically in FIG. 3. While one delay element per tap may be used in some embodiments of the present invention, as was described above with reference to FIG. 1, the delay line 305 of FIG. 3 includes twelve delay elements 310a-l. Three delay elements are provided for each tap 320a-d. Using multiple delay elements per tap may allow greater flexibility in the range of delay that can be provided by the delay line 305. For example, the bias generator 150 may produce one bias voltage, $V_{BIAS}$, that adjusts each of the delay elements 310a-l the same amount. However, in some embodiments, the bias generator 150 may produce several bias voltages, shown as $V_{BIAS1}$, $V_{BIAS2}$, and $V_{BIAS3}$ in FIG. 3. Each bias voltage may adjust a different set of delay elements 310a-l. For example, delay elements 310a, d, g, and j may be controlled by $V_{BIAS1}$ and have a large range to provide course control of the delay of the delay line 305. Delay elements 310b, e, h, and k may be controlled by $V_{BIAS2}$ and have a medium range to provide medium range control of the delay of the delay line 305. Delay elements 310c, f, i, and l may be controlled by $V_{BIAS3}$ and may have a small range to provide fine control of the delay of the delay line 305. In this manner, a delay with adaptive wide range and timing delay resolution may be achieved.

Although four taps 320a-d are shown in FIG. 3 to provide quadrature clock signals, any number of signals may be generated according to embodiments of the present invention having any phase relationship with the incoming signal, C0. Similarly, although three delay elements are shown in the delay line 305 for each tap 320a-d, any number of delay elements may be used for each tap, including more than three delay elements and less than three delay elements.

The phase detector 330 of FIG. 3 is configured to provide an adjustment signal to lock the C0, C180 and C360 signals in a single adjustment, in contrast to the two-step process performed by the phase detector 130 of FIG. 1. The operation of the phase detector 330 will now be discussed with reference to the timing diagram of FIG. 4.

The phase detector 330 utilizes the C180 signal to guide the locking of the C0 and C360 signals. Accordingly, the C180 signal serves as an enable signal in that a phase difference between the C0 and C360 signals may be determined based on information gathered during a time period that the C180 signal is at a certain logic level. When the C180 signal is at a different logic level, the information is not gathered. On receipt of a transition of the C180 signal, the phase detector 330 initiates a lock of the C0 and C360 signals. By measuring the phase difference between the C0 and C360 signals and coupling an adjustment signal indicative of the phase difference to the control signal generator, the charge-pump and loop filter 140 as shown in FIG. 3. As described above, the charge-pump and loop filter 140 couples a $V_{CONTROL}$ signal to the bias generator 150 to generate the $V_{BIAS}$ signal applied to one or more of the delay elements 310a-l to adjust the delay of the delay line 305 to minimize the phase difference between the C0 and C360 signals. Accordingly, the solid lines in FIG. 4 indicate timing signals for one example of C0, C180, and C360 signals. As the solid line example shows, the three signals having a duty cycle distortion in that the high portion of each of the signals is less than 50 percent of the clock cycle $t_{CK}$. Accordingly, C180 transitions low at time 405. This low transition can be used by the phase detector 330 to initiate the lock of C0 and C360. Accordingly, the phase detector 330 shortly detects the rising edge of C0 at time 410 followed by the rising edge of C360 at time 415. The phase detector 330 couples the adjustment signal indicative of the phase difference between the two signals to the charge pump and loop filter 140.

Figure 4:
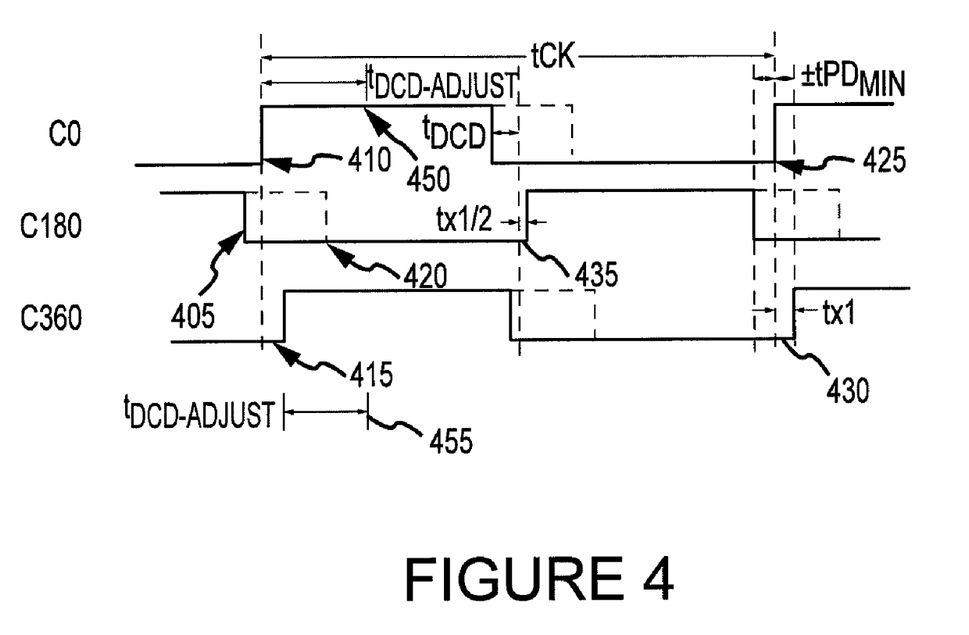
FIG. 4 is a timing diagram illustrating the operation of the signal generator of FIG. 3.

The dashed lines in FIG. 4 illustrate a case where the three signals have a duty cycle distortion causing the signals to be high for greater than 50 percent of the clock period. In this case, the falling edge of C180 that will enable the phase detector 330 occurs at time 420, after the rising edges of C0 and C360 at times 410 and 415, respectively. Accordingly the phase detector 330 does not obtain phase information regarding the rising edges of C0 and C360. When the C180 signal transitions high, the phase detector 330 is disabled, and the phase detector 330 accordingly does not obtain phase information regarding the rising edges of C0 and C360 at times 425 and 430, and will not be able to accurately lock the C0 and C360 signals. Accordingly, to accurately lock the C0 and C360 signals when the signals have a duty cycle error resulting in a high signal over 50 percent of the clock cycle, a duty cycle distortion tolerance delay element 340 is used, as shown in FIG. 3.

The duty cycle distortion tolerance delay element 340 delays C0 and C360 such that the rising edges of the C0 and C360 signals occur while the phase detector 330 is enabled. Alternatively, in some embodiments, the duty cycle distortion tolerance delay element 340 may delay the C180 signal such that the rising edges of the C0 and C360 signals occur while the phase detector 330 is enabled. The amount of delay provided by the duty cycle distortion tolerance delay element may be changed based on a frequency of the reference clock signal. In other embodiments, the amount of delay may be fixed. In FIG. 4, the amount of delay provided by the duty cycle distortion tolerance delay element 330 is shown as $t_{DCD\_Adjust}$. In the example of FIG. 4 the signals are shown containing duty cycle distortion, the C0 and C360 signals are delayed by the duty cycle distortion tolerance delay element 340. Accordingly, the rising edge of the delayed C0 signal occurs at time 450, after the falling edge of C180 at time 420 and the rising edge of the delayed C360 signal occurs at time 455, again after the falling edge of the C180 signal at time 420. In this manner, the phase detector 330 can accurately capture the phase difference between the C0 and C360 signals after being enabled by the falling edge of the C180 signal. Accordingly, the amount of delay provided by the duty cycle distortion tolerance delay element 340 may be selected based on the maximum duty cycle distortion anticipated in the C0 and C360 signals. In some embodiments, the duty cycle distortion tolerance delay element 340 provides a fixed amount of delay. In other embodiments, the delay provided by the duty cycle distortion tolerance delay element 340 is variable.

The above discussion describes a multi-phase clock signal generator using an intermediate signal as an enable signal to guide the locking of two of the generated signals. In the example described above, the 180 degree signal is used as an enable signal to facilitate the locking of the C0 and C360 signals. By locking the C0 and C360 signals, and providing delay elements 310a-l having equal amounts of delay between each of the generated signals, the C0, C90, C180, C270 and C360 signals will all accordingly be locked in a fast and accurate fashion. A specific example of circuitry used to accomplish the duty cycle distortion tolerance delay and phase locking will now be described with reference to the block diagram of FIG. 5 and the timing diagram of FIG. 6.

Figure 5:
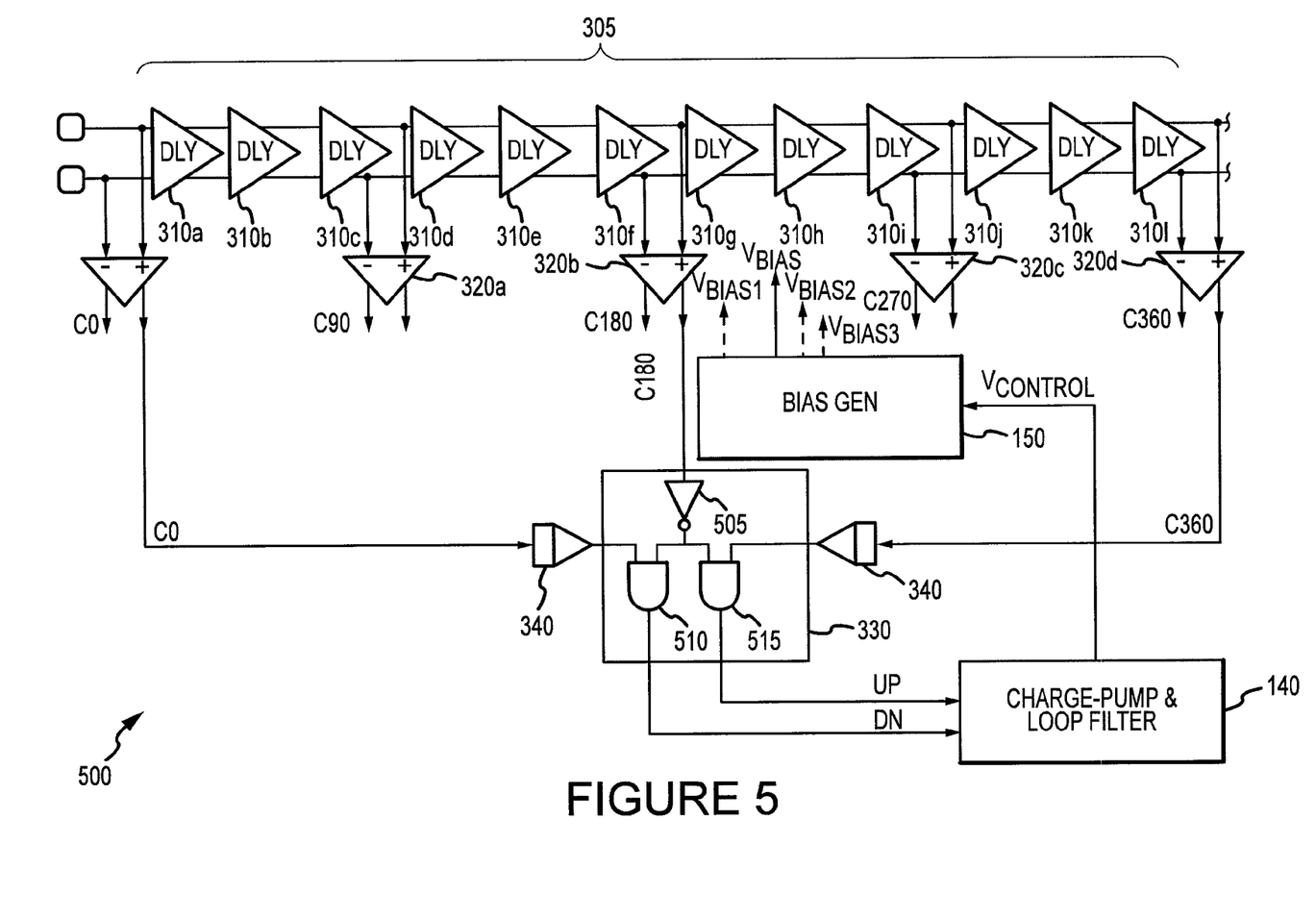
FIG. 5 is a schematic diagram of a multi-phase clock signal generator according to an embodiment of the present invention.

As shown in FIG. 5, the duty cycle distortion tolerance delay element 340 may be implemented by two delay elements receiving the C0 and C360 signals, respectively. The C180 signal is coupled to an inverter 505. The C0, C180, and C360 signals are shown in the timing diagram of FIG. 6. The inverted C180 signal is also shown with a rising edge at time 605. By inverting the C180 signal, the rising edge, at time 605, will serve as the enable signal for the phase detector 330 of FIG. 5. To represent the delay of signals C0 and C360 by the duty cycle distortion delay elements 340, the C180 signal is shown advanced an amount $t_{DCD\_Adjust}$. For purposes of illustration, advancing the C180 signal is equivalent to delaying the C0 and C360 signals. The advanced and inverted C180 signal accordingly has a rising edge at time 610, prior to the falling edges of C0 and C360 at times 620 and 615, respectively.

Figure 6:
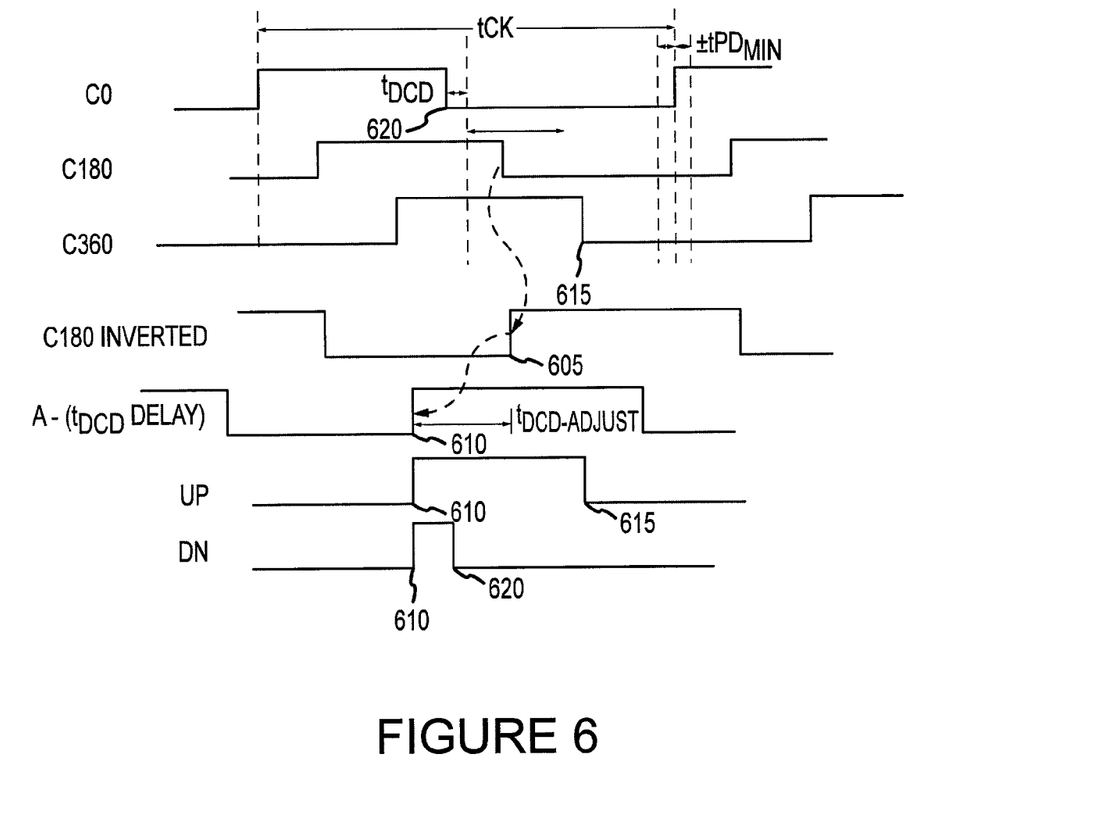
FIG. 6 is a timing diagram illustrating the operation of the signal generator of FIG. 5.

Two AND gates 510, 515 in FIG. 5 provide functionality for the phase detector 330. The first AND gate 510 provides a signal indicative of a phase difference between the C180 signal and the C0 signal by coupling a DN signal to the charge-pump and loop filter 140. The DN signal, as shown in FIG. 6, is high when both the inverted C180 signal is high and the delayed C0 signal is high. Accordingly, the DN signal is high from time 610 to time 620. The second AND gate 515 provides a signal indicative of a phase difference between the C180 signal and the C360 signal by coupling an UP signal to the charge-pump and loop filter 140. The UP signal, as shown in FIG. 6 is high when both the inverted C180 signal is high and the delayed C360 signal is high. Accordingly, the UP signal is high from time 610 to 615. The difference in the pulse widths of the DN and UP signals is indicative of the phase difference between the C0 and C360 signals. The DN and UP signals are coupled to the charge-pump and loop filter 140 as adjustment signals.

Note that, when the pulse widths of the UP and DN signals are equivalent, the C0 and C360 signals are locked, that is, the phase difference between the C0 and C360 signals is zero. Accordingly, the charge-pump and loop filter 140 are configured to adjust the delay based on a difference of pulse widths between the UP and DN signals to minimize the phase difference between the C0 and C360 signals. For example, the $V_{CONTROL}$ signal may indicate to the bias generator 150 to increase the delay of the delay line 305 during a period when the UP signal is high and the DN signal low. The $V_{CONTROL}$ signal array indicate to the bias generator 150 to decrease the delay of the delay line 305 during a period when the UP signal is low and the DN signal high. The $V_{CONTROL}$ signal may indicate to the bias generator 150 to maintain the delay of the delay line 305 when the UP and DN signals have the same level. The charge-pump and loop filter 140 may be implemented in any of a variety of ways. For example, in one embodiment the loop filter may be implemented as a capacitance. The charge pump may include a current source which charges the capacitor responsive to the UP signal being high while the DN signal is low. The charge pump may further include a current sink which discharges the capacitor responsive to the UP signal being low while the DN signal is high. The charge pump would not effect the capacitor when the UP and DN signals had the same state. In this manner, the capacitor builds a voltage which may be, or be used to generate, the $V_{CONTROL}$ signal.

Figure 7:
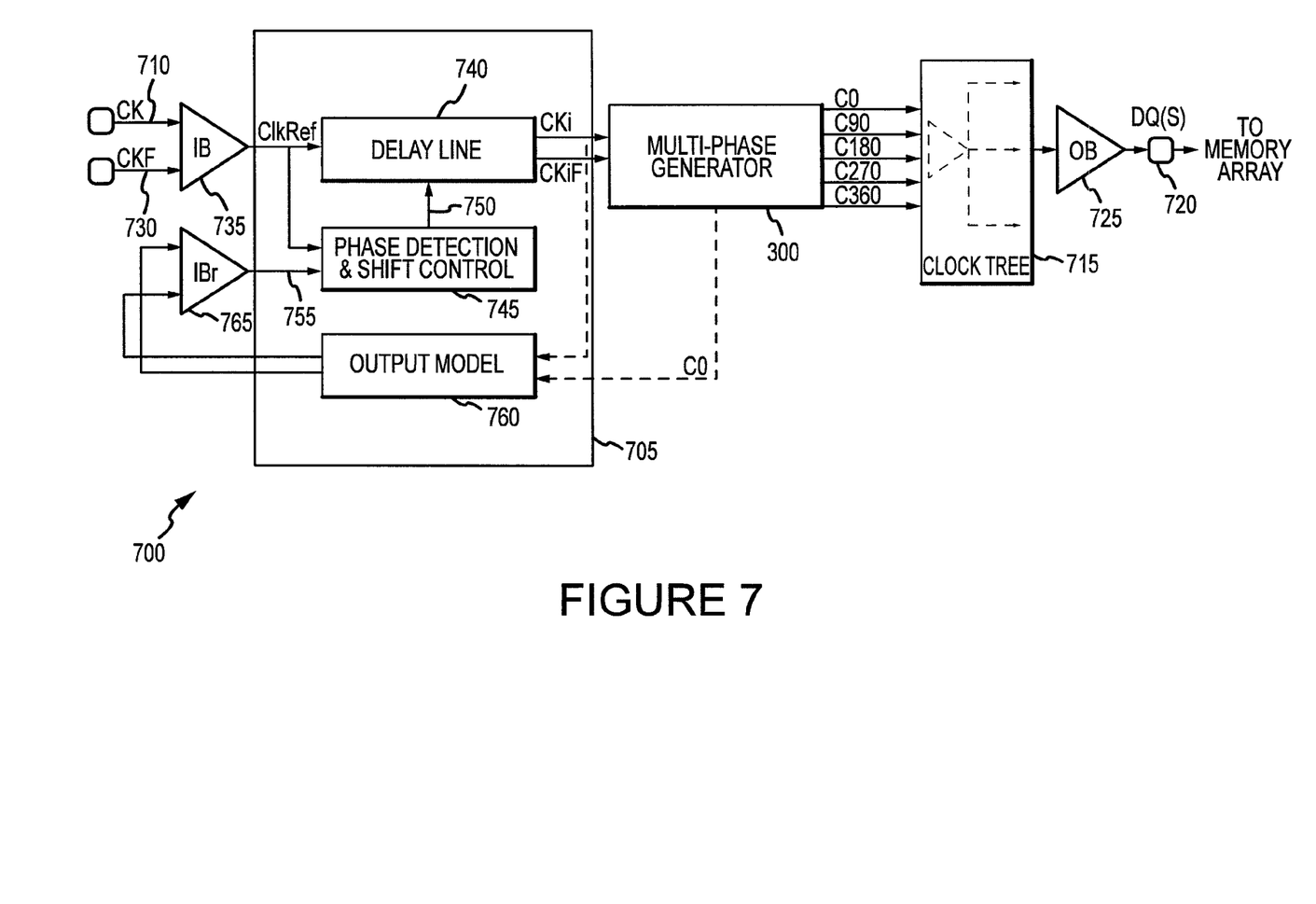
FIG. 7 is a schematic diagram of a memory device according to an embodiment of the present invention.

FIG. 7 depicts a portion of a memory device 700. The memory device receives a clock signal CK 710 and complementary clock signal CKF 730. The CK and CKF signals may be coupled to the memory device 700 by a memory controller, processor, or other electronic element. The multi-phase clock signal generator 300 of FIG. 3 is coupled to a delay locked loop 705 for use in locking the output signals of the multi-phase clock signal generator to the received clock signal CK 710. The received clock signal 710 and optional complementary signal 730 are coupled to an input buffer 735. For example, the input buffer 735 may receive the clock signals 710 and 730 from off-chip, or from another portion of a chip than the input buffer 735. The input buffer 735 couples the buffered ClkRef signal to the delay lock loop 705. The delay lock loop 705 includes a delay line 740 and a phase detection and shift control element 745. The delay line is configured and controlled by the phase detection and shift control element 745 to output a clock signal CKi, and optionally a complementary clock signal CKiF that are in phase with the ClkRef signal. The phase detection and shift control element 745 couples a control signal 750 to the delay line 740 to adjust the delay of the delay line 740 to minimize a phase difference between the ClkRef signal and a feedback signal 755. The feedback signal 755 may be based on either one of the signals generated by the multi-phase clock signal generator 300 (C0 as shown in FIG. 7), or the input signal CKi to the multi-phase clock signal generator 300, as indicated by the dashed lines in FIG. 7. In this manner, the multi-phase clock signal generator 300 may be either inside of the delay-locked loop 705 (when the signal C0 is used as the feedback signal) or outside of the delay locked loop 705 (when the CKi signal is used).

FIG. 7 also illustrates the output signals of the multi-phase clock signal generator 300 (the signals C0, C90, C180, C270, and C360) coupled to a clock tree 715 for distribution to the DQ(s) 720 of the memory device 700. In this manner, the clock signals generated by the multi-phase clock signal generator may be used to clock operation of the DQ(s) 720. Although distribution to a DQ 720 is shown in FIG. 7, the clock signals from the multi-phase clock signal generator 300 may generally be coupled to any number of DQs. Further, output signals of the multi-phase clock signal generator 300 may additionally or instead be coupled to other elements of the memory device 700 or other electronic system employing the multi-phase clock signal generator 300. An output buffer 725 may be provided at each destination to couple one or more of the clock signals to the destination, such as DQ 720.

The feedback signal used by the phase detection and shift control element 745 may be coupled to one or more model delay elements, including the output model element 760 and the buffer delay element 765 shown in FIG. 7. The buffer delay element 765 models the delay of the input buffer 735. The output model delay element 760 models the delay of an output path between the point the feedback signal was generated, and the destination of the signal generated by the multi-phase clock signal generator 300 (the clock tree 715 and the output buffer 725 in the example of FIG. 7). By delaying the feedback signal by an amount equal to the delay of the output path, the delay locked-loop minimizes the phase difference between the output signal arriving at the DQ 720 and the input clock signal 710.

Figure 8:
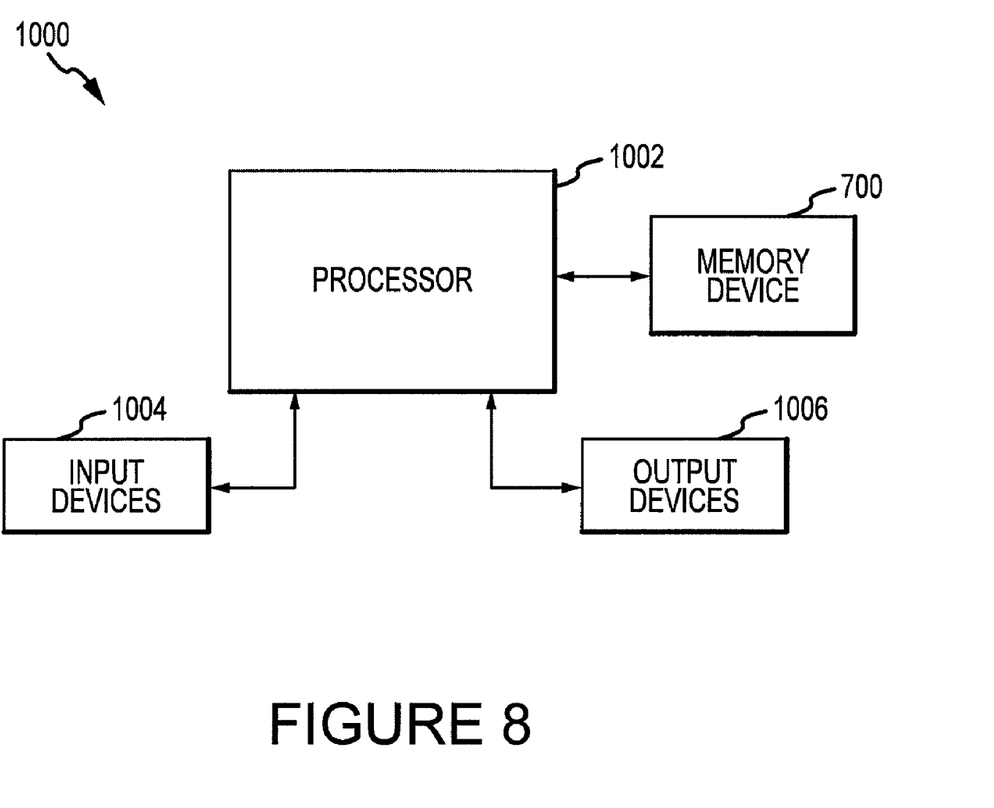
FIG. 8 is a schematic diagram of a processor-based system according to an embodiment of the present invention.

FIG. 8 is a block diagram of a processor-based system 1000 including processor 1002 that communicates with a memory device 700. The memory device 700 may be integral with or physically separate from the processor 1002 and communication between the two may take place in any manner. The memory device 700 may contain one or more multi-phase clock signal generators 300 to generate clock signals having various phases in accordance with embodiments of the invention described above. Typically, the processor 1002 is coupled through address, data, and control buses to the memory device 700 to provide for writing data to and reading data from one or more memory arrays in the memory device 700. The processor 1002 may include circuitry for performing various processing functions, such as executing specific software to perform specific calculations or tasks. In addition, the processor-based system 1000 includes one or more input devices 1004, such as a keyboard or a mouse, coupled to the processor 1002 to allow a user to interface with the processor-based system 1000. Typically, the processor-based system 1000 also includes one or more output devices 1006 coupled to the processor 1002, such as a printer or display. One or more data storage devices may also be coupled to the processor 1002 to store data or retrieve data from external storage media (not shown). Examples of such storage devices include hard and floppy disks, tape cassettes, compact disk read-only ("CD-ROMs") and compact disk read-write ("CD-RW") memories, and digital video disks ("DVDs").

The processor-based system 1000 shown in FIG. 8 may be implemented in any of a variety of products employing processors and memory including for example cameras, phones, wireless devices, displays, chip sets, set top boxes, gaming systems, vehicles, and appliances. Resulting devices employing the processor-based system 1000 may benefit from the embodiments of a multi-phase clock signal generator described above to perform their ultimate user function.

From the foregoing it will be appreciated that, although specific embodiments of the invention have been described herein for purposes of illustration, various modifications may be made without deviating from the spirit and scope of the invention. For example, although the generation of quadrature clock signals has been discussed and described, embodiments of the invention may generate substantially any number of clock signals having any phase relationship therebetween by, for example, altering a number of identical delay elements per tap in the delay line generating the clock signals. Further, although analog embodiments are shown and described above, other embodiments of the present invention may be implemented using one or more digital components.

What is claimed is:

1. A multi-phase periodic signal generator comprising:
a plurality of delay elements including a first delay element, an intermediate delay element, and a third delay element, each of the first and second delay elements coupled such that an output of a respective delay element is coupled to an input of a next delay element, each of the respective delay elements configured to delay a signal applied to an input of the respective delay element and couple the delayed signal to the respective next delay element, the first delay element configured to receive a first periodic signal, the intermediate delay element configured to output an intermediate periodic signal, and the third delay element configured to output a third signal;
a phase detector configured to receive the first signal, the third signal, and the intermediate signal, the phase detector configured to be enabled responsive to the intermediate signal and when enabled to provide a signal indicative of a phase difference between the first and third signals;
a control signal generator configured to receive the signal indicative of the phase difference between the first and third signals and generate a control signal to adjust the delay of the plurality of delay elements such that the first, intermediate and third signals have a predetermined phase relationship; and
a duty cycle distortion tolerance delay element configured to receive the first signal and the third signal, the duty cycle distortion tolerance delay element configured to delay the respective first and third signals and output the delayed first and third signals to the phase detector.

2. The multi-phase signal generator according to claim 1 wherein the duty cycle distortion tolerance delay element is configured to delay the first and third signals such that rising edges of the first and third signals occur while the phase detector is enabled.

3. The multi-phase signal generator according to claim 1 wherein the duty cycle distortion tolerance delay element comprises a first delay element coupled to the output of the third delay element and a second delay element coupled to the input of the first delay element.

4. The multi-phase signal generator according to claim 3 wherein the phase detector further comprises:
an inverter coupled to receive the intermediate signal and output an inverted intermediate signal; and
a first AND gate coupled to receive the inverted intermediate signal and the delayed first signal, the first AND gate configured to generate a first output signal when the inverted intermediate signal and the delayed first signal have a same logic level; and
a second AND gate coupled to receive the inverted intermediate signal and the delayed third signal, the second AND gate configured to generate a second output signal when the inverted intermediate signal and the delayed third signal have the same logic level.

5. The multi-phase signal generator according to claim 4 wherein the control signal generator comprises:
a charge pump and loop filter configured to receive the first and second output signals and generate a control signal to adjust the delay of the plurality of delay elements to minimize a difference between the first and second output signals.

6. The multi-phase signal generator according to claim 5 wherein the loop filter comprises a capacitance.

7. The multi-phase signal generator according to claim 5 wherein each of the plurality of delay elements includes a control input, each of the respective plurality of delay elements configured to delay the signal applied to its respective control input an amount determined by a signal applied to its respective control input, the multi-phase signal generator further comprising:
a bias generator configured to receive the control signal and couple a bias signal to the control inputs of the plurality of delay elements, the bias signal configured to adjust the delay of the delay elements to minimize the difference between the first and second output signals.

8. The multi-phase signal generator according to claim 7 wherein the plurality of delay elements includes a plurality of groups of delay elements, each group configured to provide a different resolution of signal delay control, the bias generator configured to couple a different bias signals to each respective group of delay elements.

9. The multi-phase signal generator according to claim 1 wherein the control signal generator comprises a charge pump configured to receive the signal indicative of the phase difference between the first and third signals and generate a control signal to adjust a delay of each of the plurality of delay elements to minimize the phase difference between the first and third signals.

10. The multi-phase signal generator according to claim 1 wherein the intermediate signal has a 180 degree phase difference from the first signal and the third signal has a 360 degree phase difference from the first signal.

11. The multi-phase signal generator according to claim 10 wherein one of the plurality of delay elements is configured to output a signal having a 90 degree phase difference from the first signal and another one of the plurality of delay elements is configured to output a signal having a 270 degree phase difference from the first signal.

12. The multi-phase signal generator according to claim 11 wherein the plurality of delay elements includes a first group of delay elements including the first delay element, the delay elements of the first group coupled in series and configured to output the signal having a 90 degree phase difference from the first signal and wherein the plurality of delay elements includes a second group of delay elements, the delay elements of the second group coupled in series and configured to receive the signal having a 90 degree phase difference from the first signal and output the intermediate signal having a 180 degree phase difference from the first signal, and wherein the plurality of delay elements further includes a third group of delay elements, the delay elements of the third group coupled in series and configured to output the signal having a 270 degree phase difference from the first signal, and wherein the plurality of delay elements further includes a fourth group of delay elements including the third/third element, the delay elements of the fourth group coupled in series and configured to receive the signal having a 270 degree phase difference from the first signal and output the third clock signal having a 360 degree phase difference from the first signal, and wherein the first, second, third and fourth groups of delay elements are configured to provide substantially a same amount of delay responsive to a control signal received from the bias generator.

13. The multi-phase periodic signal generator according to claim 1 wherein the plurality of delay elements each comprise single-ended delay elements.

14. The multi-phase periodic signal generator according to claim 1 wherein the plurality of delay elements each comprise double-ended delay elements.

15. The multi-phase periodic signal generator according to claim 1 wherein the control signal generator is configured to adjust the phase relationship between the first and third signals and the phase relationship between the intermediate and third signals in a single adjustment.

16. The multi-phase periodic signal generator according to claim 1 wherein the phase detector is guided by the intermediate signal.

17. A memory device comprising:
an input buffer configured to receive an input clock signal;
a multi-phase periodic signal generator coupled to the input buffer, the multi-phase periodic signal generator comprising:
a plurality of delay elements including a first delay element, an intermediate delay element, and a third delay element, each of the first and second delay elements coupled such that an output of a respective delay element is coupled to an input of a next delay element, each of the respective delay elements configured to delay a signal applied to an input of the respective delay element and couple the delayed signal to the respective next delay element, the first delay element configured to receive a first periodic signal based on the input clock signal, the intermediate delay element configured to output an intermediate periodic signal, and the third delay element configured to output a third signal;
a phase detector configured to receive the first signal, the third signal, and the intermediate signal, the phase detector configured to be enabled responsive to the intermediate clock signal and when enabled to provide a signal indicative of a phase difference between the first and third signals;
a control signal generator configured to receive the signal indicative of the phase difference between the first and third signals and generate a control signal to adjust the delay of the plurality of delay elements such that the first, intermediate and third signals have a predetermined phase relationship;

a duty cycle distortion tolerance delay element configured to receive the first signal and the third signal, the duty cycle distortion tolerance delay element configured to delay the respective first and third signals and output the delayed first and third signals to the phase detector; and an array of memory cells, the array of memory cells coupled to receive the intermediate and third signals.

18. The memory device of claim 17 further comprising:
a delay locked loop configured to receive the input signal and output the first signal, the delay locked loop configured to generate the first signal by delaying the input clock signal by a delay amount, the delay locked loop further configured to receive a feedback signal and adjust a delay of the delay line such that the first signal input to the multi-phase clock signal generator is in phase with a clock signal received by the array of memory cells.

19. The memory device of claim 18 wherein the feedback signal comprises the first signal coupled through an output model delay element having a delay amount substantially equal to an amount of delay between the input of the multi-phase clock signal generator and the array of memory cells.

20. The memory device of claim 18 wherein the feedback signal comprises the first signal output from the multi-phase clock signal generator coupled through an output model delay element having a delay amount substantially equal to an amount of delay between the output of the multi-phase clock signal generator and the array of memory cells.

21. A method for generating a plurality of periodic signals including a first clock signal, an intermediate clock signal having a first phase relationship with the first clock signal, and final clock signal having a second phase relationship with the first clock signal, the method comprising:
delaying the first signal a first delay amount to generate the intermediate clock signal;
delaying the intermediate signal a second delay amount to generate the final signal;
enabling a phase detector using the intermediate signal;
delaying the first and final signals a compensation delay amount prior to measuring the phase difference between the first and final signals;
measuring a phase difference between the first and final signals while the phase detector is enabled; and
adjusting the first and second delay amounts based on the phase difference.

22. The method according to claim 21 wherein the compensation delay amount delays the first and last signals such that rising edges of the first and last signals occur while the phase detector is enabled.

23. The method according to claim 21 further comprising changing the compensation delay amount at least in part based on a frequency of the first clock signal.

24. The method according to claim 21 wherein the act of measuring the phase difference comprises generating a first difference signal corresponding to a length of time the inverted intermediate signal and the delayed first signal have a same logic level and generating a second difference signal corresponding to a length of time the inverted intermediate signal and the delayed final signal have the same logic level.

25. The method according to claim 24 wherein the act of adjusting the first and second delay amounts comprises adjusting the first and second delay amounts to minimize a difference between the first and second difference signals.

26. The method according to claim 25 wherein the act of adjusting the first and second delay amounts comprises generating a course control signal and a fine control signal.

27. The method according to claim 21 wherein the act of measuring the phase difference comprises generating a first difference signal having a pulse from a rising edge of the inverted intermediate signal to a falling edge of the first signal and a second difference signal having a pulse from a rising edge of the inverted intermediate signal to a falling edge of the final signal.

28. The method according to claim 21 further comprising inverting the intermediate signal prior to enabling the phase detector using the intermediate signal.

29. The method according to claim 21 wherein the first phase relationship comprises 180 degrees and the second phase relationship comprises 360 degrees.

30. The method according to claim 21 further comprising coupling the first, intermediate, and final signals to a memory array.

31. The method according to claim 21 wherein the first and second delay amounts are adjusted to minimize the phase difference between the first and last signals and to alter the phase difference between the intermediate and last signals in a single adjustment.

32. The method according to claim 21 further comprising using the intermediate signal as a guide to measure the phase difference between the first and last signals.

* * * * *